United States Patent [19]

Tsuge et al.

[11] Patent Number: 4,503,339

[45] Date of Patent: Mar. 5, 1985

[54] SEMICONDUCTOR INTEGRATED CIRCUIT DEVICE HAVING A SUBSTRATE VOLTAGE GENERATING CIRCUIT

[75] Inventors: Norihisa Tsuge, Kamakura; Tomio Nakano; Masao Nakano, both of Kawasaki, all of Japan

[73] Assignee: Fujitsu Limited, Kawasaki, Japan

[21] Appl. No.: 375,308

[22] Filed: May 5, 1982

[30] Foreign Application Priority Data

May 12, 1981 [JP] Japan ................................. 56-71045

[51] Int. Cl.[3] .................... H03K 17/16; H03K 17/687

[52] U.S. Cl. ................................ 307/296 R; 307/304; 363/60

[58] Field of Search ................... 307/296 R, 297, 304; 324/158 T; 363/60

[56] References Cited

U.S. PATENT DOCUMENTS

| | | | |
|---|---|---|---|
| 3,750,018 | 7/1973 | Leone et al. | 324/158 T |
| 3,806,741 | 4/1974 | Smith | 307/304 |
| 4,115,710 | 9/1978 | Lou | 307/304 |
| 4,142,114 | 2/1979 | Green | 307/297 |
| 4,229,667 | 10/1980 | Heimbigner et al. | 307/297 |
| 4,382,229 | 5/1983 | Cottrell et al. | 324/158 T |
| 4,388,537 | 6/1983 | Kanuma | 307/297 |
| 4,435,652 | 3/1984 | Stevens | 307/297 |

OTHER PUBLICATIONS

Harroun, "Substrate Bias Voltage Control", IBM Tech. Disc. Bull., vol. 22, No. 7, Dec. 1979, pp. 2691-2692.

*Primary Examiner*—Larry N. Anagnos
*Assistant Examiner*—D. Reagan Hudspeth
*Attorney, Agent, or Firm*—Staas & Halsey

[57] ABSTRACT

A semiconductor device comprising a substrate voltage-generating circuit which has an oscillating circuit and a pumping circuit. The substrate voltage-generating circuit also has a control circuit for controlling the application of the output signal of the oscillating circuit to the pumping circuit and a terminal electrode for receiving an external signal to control the control circuit and to stop the application of the output signal of the oscillating circuit to the pumping circuit.

9 Claims, 7 Drawing Figures

SEMICONDUCTOR INTEGRATED CIRCUIT DEVICE HAVING A SUBSTRATE VOLTAGE GENERATING CIRCUIT

BACKGROUND OF THE INVENTION

The present invention relates to a MOS semiconductor device having a substrate voltage-generating circuit.

In a semiconductor substrate in which a large number of semiconductor elements, especially MOS semiconductor elements, are formed, the potential of the semiconductor substrate is generally maintained at a predetermined value to ensure stable operation of the semiconductor elements. In order to maintain the potential of the substrate at a predetermined value, an external voltage may be applied to the substrate. However, in such a case, it is necessary to provide an extra terminal pin. Therefore, in many cases an integrated circuit (IC) has a substrate voltage-generating circuit therein.

The above-mentioned substrate voltage-generating circuit, illustrated in FIG. 1, is a typical example of a prior art substrate voltage-generating circuit. In FIG. 1, 1 indicates an oscillating circuit and 2 indicates a pumping circuit. The oscillating circuit 1 has an oscillator 11, a waveform shaping circuit 12, and an output-stage circuit 13. The waveform shaping circuit 12 comprises the MOS transistors $Q_1$, $Q_2$, $Q_3$ and $Q_4$, the output-stage circuits 13 comprises the MOS transistors $Q_5$ and $Q_6$, and the pumping circuit 2 comprises a MOS capacitor $Q_7$ and the MOS transistors $Q_8$, $Q_9$.

In the substrate voltage-generating circuit of FIG. 1, a rectangular waveform signal S1, alternating between "H" and "L" levels, which is generated by the oscillator 11 is input into the wave-form shaping circuit 12. In the waveform shaping circuit 12, the MOS transistors $Q_1$ and $Q_2$ form a first inverter and the MOS transistors $Q_3$ and $Q_4$ form a second inverter. The signal S1 from the oscillator 11 is shaped and inverted by the first inverter. The output signal S2 of the first inverter is input into the second inverter and is inverted by it. The output signal S2 of the first inverter is also input to the gate of the MOS transistor $Q_6$ of the output-stage circuit 13, and the output signal S3 of the second inverter is input to the gate of the MOS transistor $Q_5$ of the output-stage circuit 13.

Since the signal S3 is the inverted signal of the signal S2, the MOS transistors $Q_5$ and $Q_6$ are turned ON and OFF in turn. When the transistor $Q_5$ is turned ON and the transistor $Q_6$ is turned OFF, the potential $V_{N1}$ of the node $N_1$ is pushed up by the cpacitance of the MOS capacitor $Q_7$; however, the potential $V_{N1}$ is clamped near the threshold voltage $V_{th}$ of the MOS transistor $Q_8$ because the transistor $Q_8$ is turned ON when the potential $V_{N1}$ increases at the level of $V_{th}$. In this condition, when the transistor $Q_5$ is turned OFF and the transistor $Q_6$ is turned ON, the gate voltage $V_G$ of the MOS capacitor $Q_7$ is changed from "H" level to "L" level. Then the potential $V_{N1\ of\ the\ node\ N1}$ is decreased by the capacitance of the MOS capacitor $Q_7$ and becomes lower than the substrate voltage $V_{BB}$. The MOS transistor $Q_9$, which is connected as a diode, is turned ON, and the electric charge in the substrate is drawn out through the MOS transistor $Q_9$ into the capacitance of the MOS capacitor $Q_7$.

The above-mentioned pumping operation of the pumping circuit 2 is illustrated in FIG. 2. In FIG. 2, the waveforms of the voltages $V_G$, $V_{N1}$, and $V_{BB}$ are illustrated. As described above, according to the substrate voltage-generating circuit of FIG. 1, the electric charge in the substrate is drawn out through the pumping capacitor $Q_7$ to the ground terminal $V_{SS}$ so the substrate potential $V_{BB}$ is set at a predetermined negative value.

A sectional view of the semiconductor device comprising the substrate voltage-generating circuit of FIG. 1 is illustrated in FIG. 3. In FIG. 3, 3 indicates a p-type semiconductor substrate. On the substrate 3, the MOS capacitor $Q_7$, the node $N_1$, the MOS transistor $Q_9$, and the output terminal $T_a$ are formed. The node $N_1$ and the terminal $T_a$ are formed as $N^+$-type diffusion layers. A wiring line $L_1$ is provided for connecting the gate of the MOS transistor $Q_9$ to the node $N_1$ and another wiring line $L_2$ is provided for connecting the node $N_1$ to the substrate 3.

The above-mentioned substrate voltage-generating circuit of FIG. 1 is incorporated into the semiconductor substrate 3 on which the semiconductor device is formed, and accordingly the output voltage $V_{BB}$ of the substrate voltage-generating circuit of FIG. 1 has a fixed relation to the voltage source $V_{CC}$ fed to the semiconductor device. The above-mentioned semiconductor device must be operated normally in the predetermined range of the voltage source $V_{CC}$ and in the predetermined range of the substrate voltage $V_{BB}$. The above-mentioned normal operation area on the $V_{CC}$-$V_{BB}$ plane is shown as $C_1$ in FIG. 4. In FIG. 4, $V_{CC0}$ indicates the standard value of the voltage source $V_{CC}$, i.e. 5.0 V, and $V_{BB0}$ indicates the standard value of the substrate voltage $V_{BB}$, i.e. $-3.0$ V.

Each chip of the semiconductor device which has been manufactured according to a normal process is expected to have a normal operation area shown as $C_1$ in FIG. 4. However, some faulty semiconductor device may have such a normal operation area as shown as $C_3$ or $C_4$ in FIG. 4. Such a semiconductor device with an abnormal margin for the substrate voltage should be detected by means of the wafer-probing test and removed.

In order to determine whether a semiconductor device has an abnormal margin, it is necessary to test the semiconductor device on some operation points inside the normal operation area $C_1$, such as $P_1$, $P_2$, $P_3$ and $P_4$. However, in the semiconductor device comprising the substrate voltage-generating circuit of FIG. 1, the substrate voltage $V_{BB}$, i.e. the output voltage of the above-mentioned circuit, has a relation to the voltage source $V_{CC}$ as shown as $C_2$ in FIG. 4. Accordingly, in the above-mentioned semiconductor device, such operation points as $P_1$ and $P_3$ can not be realized.

In order to realize such operation points as $P_1$ and $P_3$ in the above-mentioned semiconductor device, it is necessary to apply an external voltage to the terminal $T_a$ so as to force the substrate voltage to change. However, applying an external voltage to the terminal $T_a$ may cause some difficulty. That is, if the substrate voltage $V_{BB}$ is forced to change to near ground level by the external voltage in order to realize the operation point $P_1$, the voltage $V_{N1}$ of the node $N_1$ becomes substantially negative to the substrate voltage $V_{BB}$ because in such a condition the substrate voltage-generating circuit is still operating. Accordingly, the PN junction formed by the node $N_1$ and the substrate 3 as shown in FIG. 3 is supplied with a forward voltage so that a large forward current flows through the above-mentioned PN junction, and a large number of electrons are injected from the node $N_1$ into the substrate 3. These injected electrons may be introduced into the channels of the MOS transistors, thereby interfering with the normal operation of the semiconductor device.

In the semiconductor device comprising the substrate voltage-generating circuit of FIG. 1, a problem exists as described above, in that the margin test for the voltage source $V_{CC}$ and the substrate voltage $V_{BB}$ can not be effected exactly.

SUMMARY OF THE INVENTION

The main object of the present invention is to solve the above-mentioned problem and by providing a semiconductor device having a substrate voltage-generating circuit in which operation of the substrate voltage-generating circuit can be stopped when the margin test for the voltage source $V_{CC}$ and the substrate voltage $V_{BB}$ is effected.

In accordance with the present invention, there is provided a semiconductor device comprising a substrate voltage-generating circuit which has on the same substrate an oscillating circuit and a pumping circuit operating in response to the output signal of the oscillating circuit. The substrate voltage-generating circuit also has a control circuit for controlling the application of the output signal of the oscillating circuit to the pumping circuit and a terminal electrode for receiving an external signal to control the control circuit and to stop the application of the output signal of the oscillating circuit to the pumping circuit.

DESCRIPTION OF THE PREFERRED EMBODIMENTS

Figure 5:
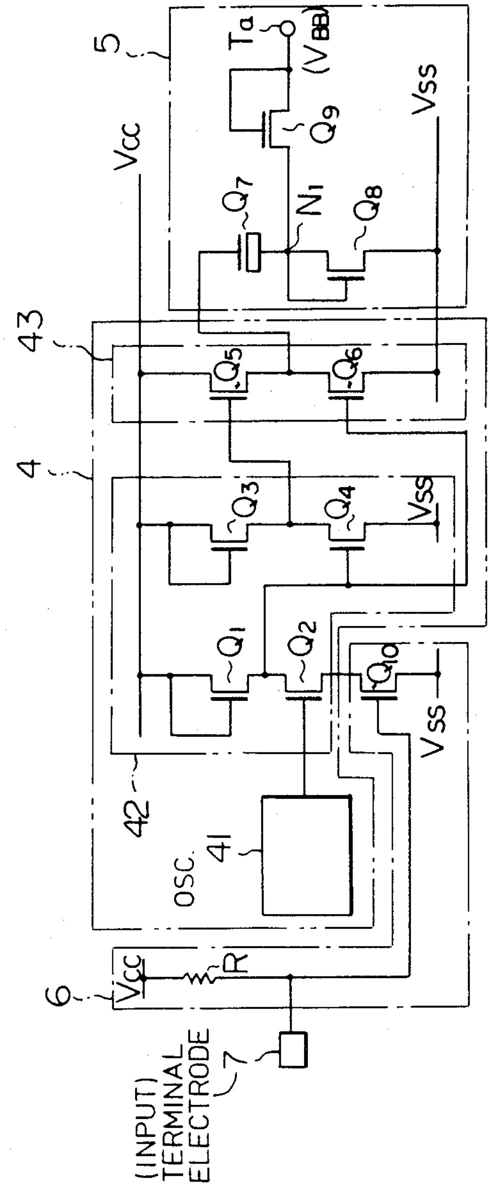
FIG. 5 is a circuit diagram of a substrate voltage-generating circuit in a semiconductor device in accordance with a first embodiment of the present invention.

A substrate voltage-generating circuit in a semiconductor device in accordance with a first embodiment of the present invention is illustrated in FIG. 5. The substrate voltage-generating circuit of FIG. 5 comprises an oscillating circuit 4, a pumping circuit 5, a control circuit 6, and a terminal electrode 7. The oscillating circuit 4 has an oscillator 41, waveform shaping circuit 42, and an output-stage circuit 43.

Figure 1:
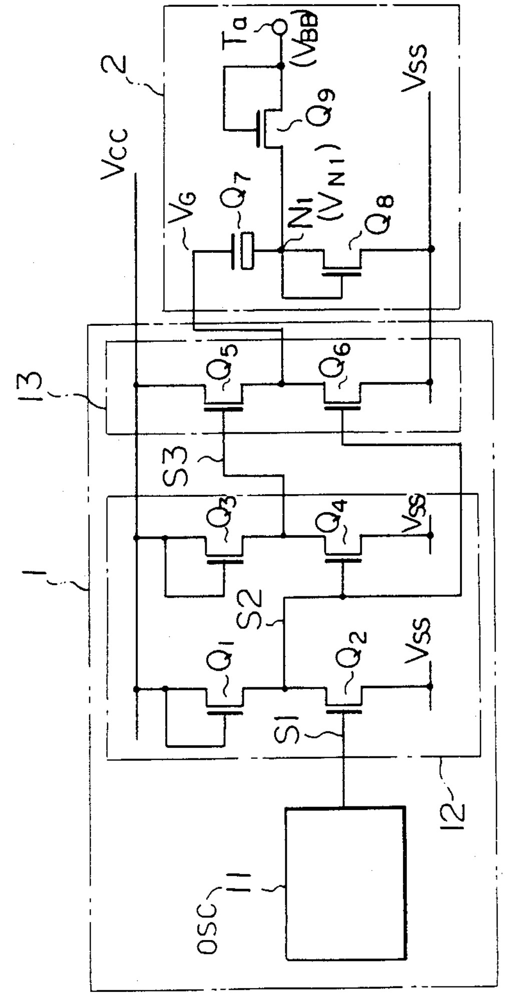
Fig. 1 PRIOR ART
FIG. 1 is a circuit diagram of a prior art substrate voltage-generating circuit in a semiconductor device.
Figure 2:
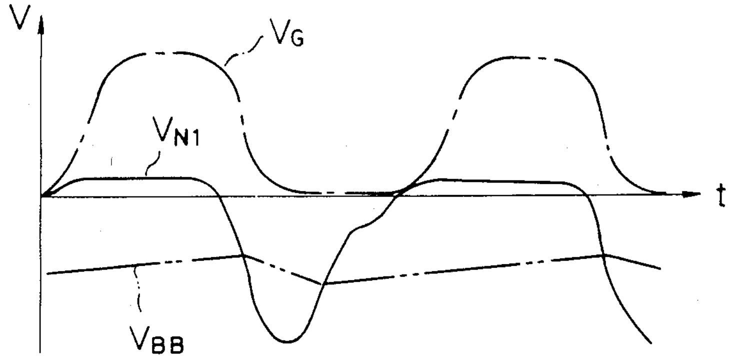
FIG. 2 is a graph of various voltage waveforms in the substrate voltage-generating circuit of FIG. 1.
Figure 3:
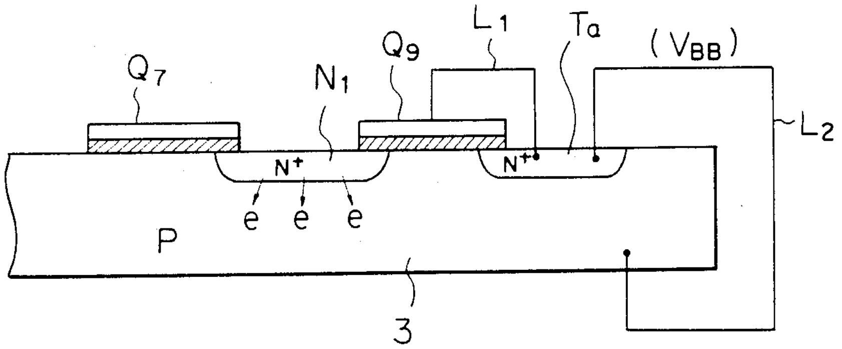
FIG. 3 is a schematic sectional view of the principal portion of the semiconductor device of FIG. 1.

The waveform shaping circuit 42 comprises the MOS transistors $Q_1$, $Q_2$, $Q_3$ and $Q_4$. The output-stage circuit 43 comprises the MOS transistors $Q_5$ and $Q_6$. The pumping circuit 5 comprises a MOS capacitor $Q_7$ and the MOS transistors $Q_8$ and $Q_9$. The control circuit comprises a MOS transistor $Q_{10}$ and a resistor R. The substrate voltage-generating circuit of FIG. 5 has the same construction as that of FIG. 1 except that it has a control circuit 6 and a terminal electrode 7. The MOS transistor $Q_{10}$ of the control circuit 6 is connected in series with the MOS transistors $Q_1$ and $Q_2$ between the voltage source $V_{CC}$ and ground $V_{SS}$. The gate of the MOS transistor $Q_{10}$ is connected to the voltage source $V_{CC}$ through the resistor R. The gate of the MOS transistor $Q_{10}$ is also connected to the terminal electrode 7.

If the terminal electrode 7 is open, i.e. disconnected, the gate voltage of the MOS transistor $Q_{10}$ is pulled up to the voltage source $V_{CC}$ and the MOS transistor is turned ON. In this condition, the operation of the substrate voltage-generating circuit of FIG. 5 is the same as that of FIG. 1. In the substrate voltage-generating circuit of FIG. 1, the output signal of the oscillating circuit 4 is applied to the gate of the MOS capacitor $Q_7$ and the pumping circuit 5 operates to maintain the substrate voltage $V_{BB}$ at the predetermined negative value in the same manner described with regard to the circuit of FIG. 1.

Figure 4:
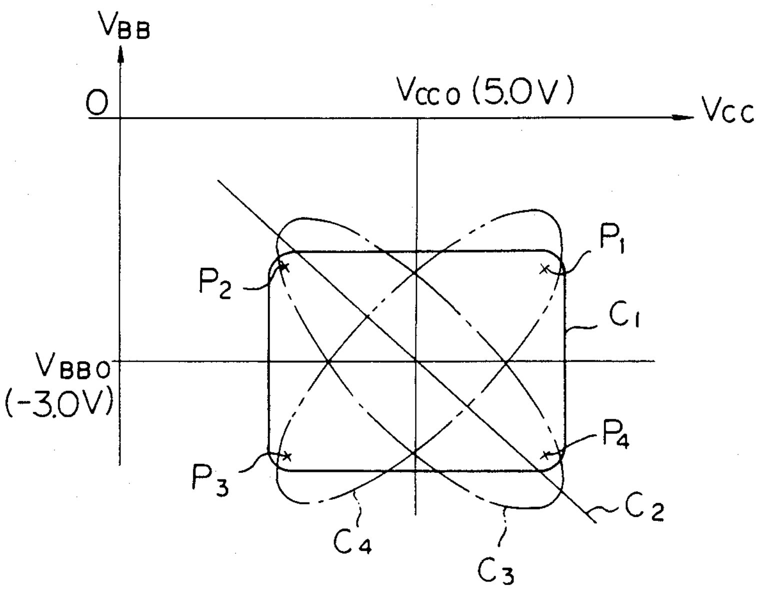
FIG. 4 is a graph of the margin characteristics of the voltage source $V_{CC}$ and the substrate voltage $V_{BB}$ of the semiconductor device of FIG. 1.

If the terminal electrode 7 is touched with a probe connected to ground $V_{SS}$, the MOS transistor $Q_{10}$ is turned OFF so that the output signal is fixed to the "L" level and the pumping circuit 5 stops operating. In this condition, the substrate voltage $V_{BB}$ can be freely set by applying an external voltage to the terminal $T_a$. Accordingly, the $V_{CC}$-$V_{BB}$ margin test for the semiconductor device having the substrate voltage-generating circuit of FIG. 5 can be effected on any operation points inside the area $C_1$ in FIG. 4 without interfering with the normal operation of the device. When the $V_{CC}$-$V_{BB}$ margin test is finished, the probe is removed from the terminal electrode 7 and the substrate voltage-generating circuit again operates normally.

Figure 6:
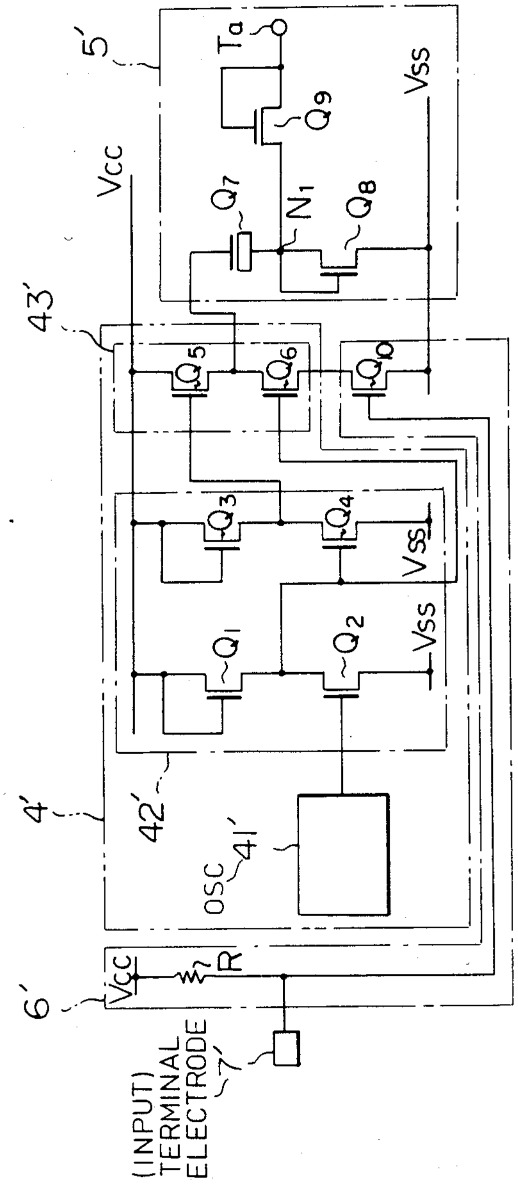
FIG. 6 is a circuit diagram of a substrate voltage-generating circuit in a semiconductor device in accordance with a second embodiment of the present invention.

A substrate voltage-generating circuit in a semiconductor device in accordance with a second embodiment of the present invention is illustrated in FIG. 6. The substrate voltage-generating circuit of FIG. 6 comprises an oscillating circuit 4', a pumping circuit 5', a control circuit 6', and a terminal electrode 7'. The substrate voltage-generating circuit has the same construction as that of FIG. 5 except that the MOS transistor $Q_{10}$ of the control circuit 6' is connected in series with the MOS transistors $Q_5$ and $Q_6$ of the output-stage circuit 43' between the voltage source $V_{CC}$ and ground $V_{SS}$.

In the substrate voltage-generating circuit of FIG. 6, when the terminal electrode 7' is open, the MOS transistor $Q_{10}$ of the control circuit 6' is turned ON, the output signal of the oscillating circuit 4' is applied to the gate of the MOS capacitor $Q_7$ of the pumping circuit 5', and the pumping circuit 5' operates to maintain the substrate voltage $V_{BB}$ at the predetermined negative value. When the terminal electrode 7' is touched with a probe connected to ground $V_{SS}$, the transfer $Q_{10}$ is turned OFF so that the output signal of the oscillating circuit 4' is fixed to the "H" level and operation of the pumping circuit 5' is stopped. In this condition, the $V_{CC}$-$V_{BB}$ margin test for the semiconductor device can be effected without interfering with the normal operation of the device.

Figure 7:
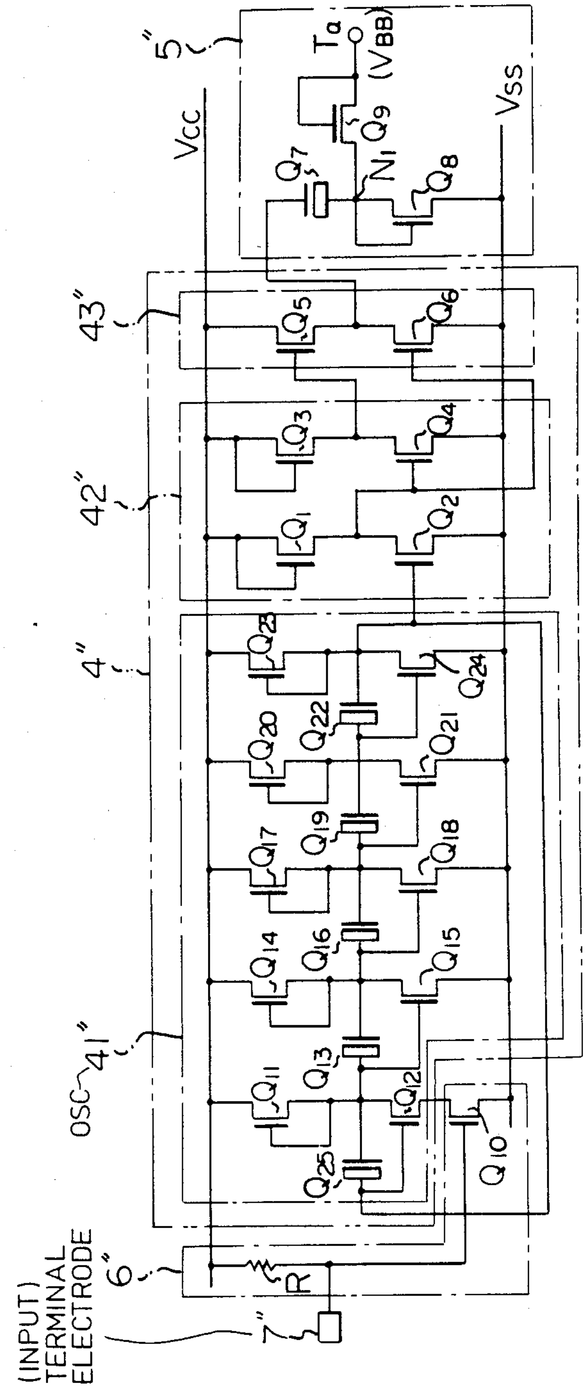
FIG. 7 is a circuit diagram of a substrate voltage-generating circuit in a semiconductor device in accordance with a third embodiment of the present invention.

Another substrate voltage-generating circuit in accordance with a third embodiment of the present invention is illustrated in FIG. 7. The substrate voltage-generating circuit of FIG. 7 comprises an oscillating circuit 4'', a pumping circuit 5'', a control circuit 6'', and a terminal electrode 7''. The oscillating circuit 4'' has an oscillator 41'', a waveform shaping circuit 42'', and an output-stage circuit 43''. The oscillator 41'' is formed as a ring oscillator with five stages and comprises the MOS transistors $Q_{11}$, $Q_{12}$, $Q_{14}$, $Q_{15}$, $Q_{17}$, $Q_{18}$, $Q_{20}$, $Q_{21}$, $Q_{23}$, and $Q_{24}$ and the MOS capacitors $Q_{13}$, $Q_{16}$, $Q_{19}$, $Q_{22}$, and $Q_{25}$. The MOS transistor $Q_{10}$ of the control circuit 6″ is connected in series with the MOS transistors $Q_{11}$ and $Q_{12}$ of the first stage of the oscillator 41″ between the voltage source $V_{CC}$ and the ground $V_{SS}$. In the substrate voltage-generating circuit of FIG. 7, when the terminal electrode 7″ is touched with a probe being connected to the ground $V_{SS}$, operation of the oscillating circuit 4″ is stopped and its output signal is fixed at the "H" or "L" level so that operation of the pumping circuit 5″ is stopped.

As described above, according to the present invention, the $V_{CC}$-$V_{BB}$ margin test for a semiconductor device having a substrate voltage-generating circuit can be effected by using a simple means.

We claim:

1. A semiconductor device, operatively connected to receive an external signal, having a semiconductor substrate, comprising:
- a substrate voltage-generating circuit comprising:
- an oscillating circuit, operatively connected to said substrate voltage generating circuit, for generating an output signal;
- a pumping circuit, operatively connected to said oscillating circuit, operating in response to said output signal of said oscillating circuit and applying a predetermined substrate bias voltage to the semiconductor substrate;
- a terminal electrode for receiving the external signal; and
- a control circuit, operatively connected between said terminal electrode and said oscillating circuit, for stopping the application of said output signal from said oscillating circuit to said pumping circuit upon receipt of the external signal, said pumping circuit stopping the application of said predetermined substrate bias voltage to the semiconductor substrate.

2. A semiconductor device as claimed in claim 1, wherein said oscillating circuit comprises:
- an output stage circuit operatively connected to said pumping circuit;
- a waveform shaping circuit operatively connected to said output stage; and;
- an oscillator operatively connected to said waveform shaping circuit.

3. A semiconductor device as claimed in claim 2, wherein said control circuit is incorporated into said waveform shaping circuit of said oscillating circuit.

4. A semiconductor device as claimed in claim 2, wherein said control circuit is incorporated into said output-stage circuit of said oscillating circuit.

5. A semiconductor device as claimed in claim 2, wherein said oscillator of said oscillating circuit is a ring oscillator with multi-stages, and wherein said control circuit is incorporated into one stage of said ring oscillator.

6. A device as claimed in claim 1 wherein said pumping circuit comprises:
- a first transistor;
- a second transistor operatively connected to said first transistor; and
- a capacitor, operatively connected to said first and second transistor and to said output stage of said oscillating circuit.

7. A device as claimed in claim 1, wherein said control circuit comprises:
- a thrid transistor operatively connected in series with said waveform shaping circuit and to said terminal electrode; and
- a resistor operatively connected to said third transistor and said terminal electrode.

8. A device as claimed in claim 7, wherein said output stage comprises a fourth and fifth transistor connected in series with said third transistor of said control circuit.

9. A device as claimed in claim 7 wherein said oscillating circuit comprises a ring oscillator operatively connected to said third transistor of said control circuit.

* * * * *

UNITED STATES PATENT AND TRADEMARK OFFICE
CERTIFICATE OF CORRECTION

PATENT NO. : 4,503,339
DATED : March 5, 1985
INVENTOR(S) : TSUGE et al.

It is certified that error appears in the above-identified patent and that said Letters Patent is hereby corrected as shown below:

Col. 3
Line 66, "circuit" s/b --circuit 6--.

Col. 6
Line 20, "1" s/b --1,--;
Line 38, "7" s/b --7,--.

Signed and Sealed this

*Sixth* Day of *August 1985*

[SEAL]

*Attest:*

DONALD J. QUIGG

*Attesting Officer* *Acting Commissioner of Patents and Trademarks*